United States Patent
Ohashi (10) Patent No.: US 10,522,372 B2
(45) Date of Patent: Dec. 31, 2019

(54) PLASMA PROCESSING DEVICE

(71) Applicant: TOSHIBA MEMORY CORPORATION, Minato-ku, Tokyo (JP)

(72) Inventor: Takashi Ohashi, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/907,464

(22) Filed: Feb. 28, 2018

(65) Prior Publication Data

US 2019/0080935 A1 Mar. 14, 2019

(30) Foreign Application Priority Data

Sep. 8, 2017 (JP) .................. 2017-173450

(51) Int. Cl.
*H01L 21/67* (2006.01)
*H01L 21/3065* (2006.01)
(Continued)

(52) U.S. Cl.
CPC ........ *H01L 21/67069* (2013.01); *H01J 37/24* (2013.01); *H01J 37/3244* (2013.01);
(Continued)

(58) Field of Classification Search
CPC ............ H01L 21/67069; H01L 21/3065; H01J 37/3255; H01J 37/24; H01J 37/32449; H01J 2237/334; H01J 37/32816; H01J 37/3244; H01J 37/32623; H01J 37/32633; H01J 2237/3341; H01J 2237/3343; H01J 2237/3344; H01J 2237/3345; H01J 2237/3348; H01J 37/32357; H01J 37/32091; H01J 37/32009; H01J 37/32082; H01J 2237/327; H01J 2237/32;
(Continued)

(56) References Cited

U.S. PATENT DOCUMENTS 9,236,272 B2   1/2016  Moriya
2009/0289179 A1*  11/2009  Chen ................ H01J 37/32357
                                                        250/251

(Continued)

FOREIGN PATENT DOCUMENTS

JP   H5-102083 A    4/1993
JP   2639158 B2     8/1997
(Continued)

OTHER PUBLICATIONS

English Machine Translation of Sugiyama et al. JP2016143583 retrieved from Espacenet on Mar. 14, 2019. (Year: 2019).*

Primary Examiner — Rakesh K Dhingra
Assistant Examiner — Laureen Chan
(74) Attorney, Agent, or Firm — Foley & Lardner LLP (57) ABSTRACT

A plasma processing device includes a stage, a cluster generation machine, and a plasma generation machine. The stage is disposed in a processing chamber. The stage may support a substrate. The cluster generation machine generates cluster gas by clustering process gas. The plasma generation machine generates plasma of at least one of the process gas and the cluster gas in the processing chamber. The plasma generation machine processes the substrate using the generated plasma.

13 Claims, 4 Drawing Sheets

(51) Int. Cl.
*H01J 37/32* (2006.01)
*H01J 37/24* (2006.01)

(52) U.S. Cl.
CPC .... *H01J 37/3255* (2013.01); *H01J 37/32091* (2013.01); *H01J 37/32449* (2013.01); *H01L 21/3065* (2013.01); *H01J 37/32816* (2013.01); *H01J 2237/334* (2013.01)

(58) Field of Classification Search
CPC ........ C23C 16/45561; C23C 16/45582; C23C 16/45585; B08B 5/00; B08B 7/00
See application file for complete search history.

(56) References Cited

U.S. PATENT DOCUMENTS

| | | | |
|---|---|---|---|
| 2014/0076849 A1* | 3/2014 | Moriya | H01L 21/31116 216/58 |
| 2014/0283747 A1* | 9/2014 | Kasai | C23C 16/4401 118/723 R |
| 2018/0015510 A1* | 1/2018 | Dobashi | H01J 37/32449 |

FOREIGN PATENT DOCUMENTS

| | | | |
|---|---|---|---|
| JP | 2016143583 A | * | 8/2016 |
| JP | 2016-192534 A | | 11/2016 |

\* cited by examiner

PLASMA PROCESSING DEVICE

CROSS-REFERENCE TO RELATED APPLICATION

This application claims the benefit of and priority to Japanese Patent Application No. 2017-173450, filed Sep. 8, 2017, the entire contents of which are incorporated herein by reference.

FIELD

Embodiments described herein relate generally to a plasma processing device.

BACKGROUND

In recent years, with the progress of refinement of semiconductor devices, processing conditions are diversified in semiconductor device processing technology. Improvement in processing accuracy for each processing condition is desired. Therefore, it is desired to improve the processing accuracy with respect to a substrate corresponding to a processing target in an etching technology using a plasma processing device.

DETAILED DESCRIPTION

Some embodiment provide a plasma processing device in which it is possible to easily improve a processing accuracy with respect to a substrate.

According to some embodiments, a plasma processing device includes a stage, a cluster generation machine, and a plasma generation machine. The stage is disposed in a processing chamber. A substrate is placed on the stage. The cluster generation machine generates cluster gas by clustering process gas. The plasma generation machine generates plasma of at least one of the process gas and the cluster gas in the processing chamber. The plasma generation machine processes the substrate using the generated plasma.

The plasma processing device according to embodiments is described in detail with reference to the accompanying drawings below. The plasma processing device is not limited to the exemplary embodiments disclosed.

Embodiment

A plasma processing device according to some embodiments is described. In a semiconductor device manufacturing procedure, a minute etching process is performed on a film to be processed in such a way that the plasma processing device generates plasma of process gas and ionizes the process gas, and the film to be processed on a substrate is irradiated with ions (reactive ions) of the process gas. Given the advanced requirements for semiconductor devices, it is desired to improve a processing accuracy as to the substrate, corresponding to a processing target, in an etching technology using the plasma processing device.

For example, fine-dimension openings may require processing with a high aspect ratio. If a mask pattern corresponding to the fine-dimension openings is formed on a resist or the like on the film to be processed, and the etching process starts on the film to be processed using the plasma processing device with using that mask pattern as a mask, unintended spattering may occur on a surface of the resist or the film to be processed. If that occurs, substances removed via the spattering are accumulated on inner surfaces or the like of parts to be processed (fine-dimension openings) and the parts to be processed (fine-dimension openings) are closed. Etching can become insufficient, making processing at the high aspect ratio difficult. In a case where processing energy increases such that the accumulated substances are etched and removed, processing dimensions (diameters of the openings) become wide, and thus minute processing may become difficult.

Here, according to some embodiments, a cluster generation machine is added to a plasma processing device 1, and the plasma processing device 1 is configured such that a plasma process of the process gas and a plasma process of the cluster gas are respectively performed in the processing chamber. This improves an accuracy of the etching process.

Figure 1:
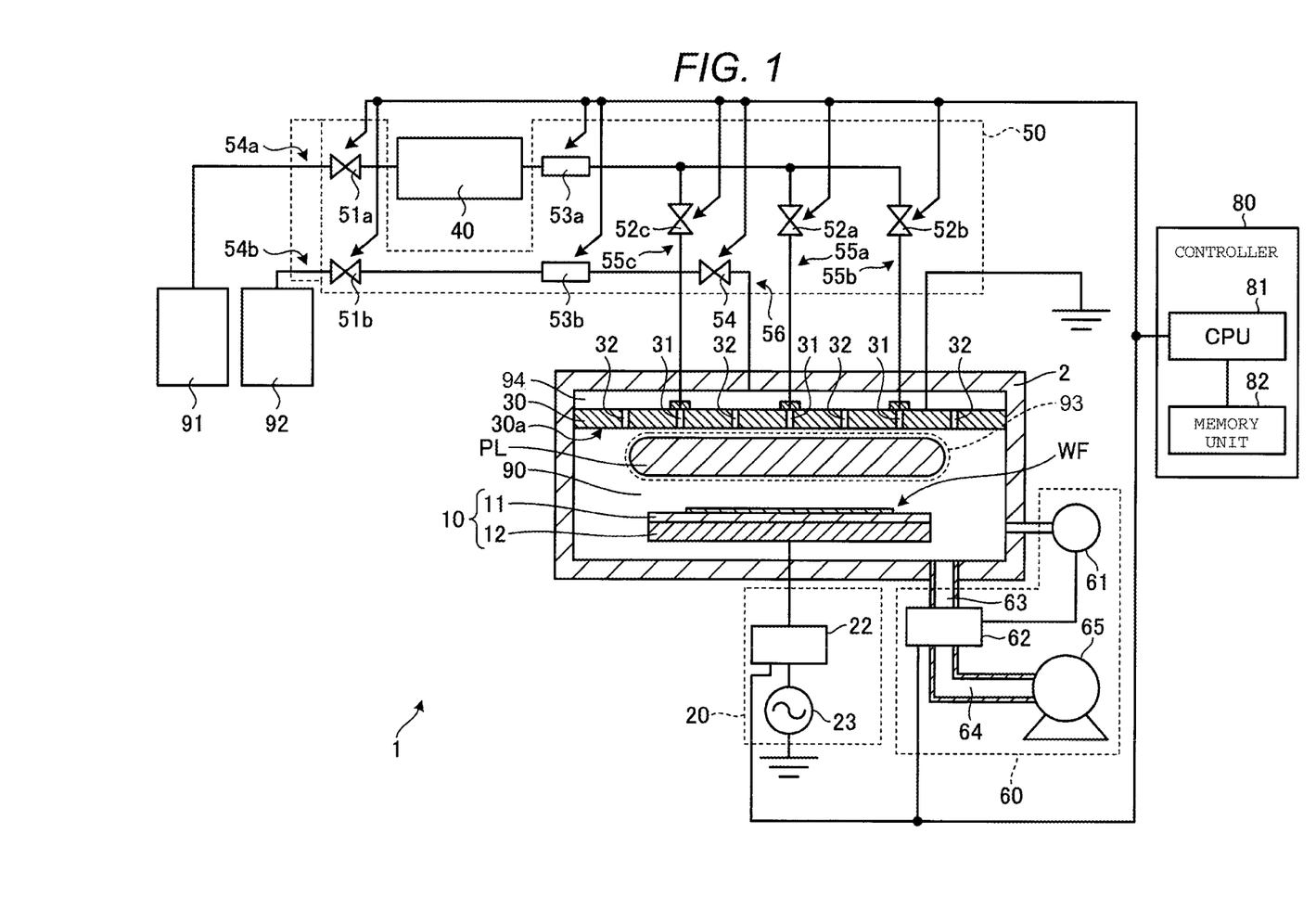
FIG. 1 shows a configuration of a plasma processing device according to some embodiments.

Specifically, the plasma processing device 1 may be configured as denoted in FIG. 1. FIG. 1 shows a configuration of the plasma processing device 1.

The plasma processing device 1 may include a processing chamber 90, a gas supply control unit 50, a cluster generation machine 40, a lower electrode 10, a shower head 30, a plasma generation machine 20, an evacuation control unit 60, and a controller 80.

The processing chamber 90 is a chamber provided such that plasma PL occurs therein, and is formed by a processing container 2. The processing container 2 is configured such that the process gas and/or cluster gas can be supplied from the gas supply control unit 50 to the processing chamber 90, and is configured such that the process gas and/or cluster gas, which is completely processed, can be evacuated to the evacuation control unit 60 from the processing chamber 90.

The gas supply control unit 50 controls the amount of process gas and/or cluster gas to be supplied (a flow rate of the process gas and/or cluster gas to be supplied to the processing chamber 90) to the processing chamber 90. Specifically, the gas supply control unit 50 includes a plurality of gas supplying pipes 54a and 54b, a plurality of on-off valves 51a and 51b, a plurality of flow rate controllers 53a and 53b, a plurality of on-off valves 52a to 52c, a plurality of gas supplying pipes 55a to 55c, an on-off valve 54, and a gas supplying pipe 56.

The cluster generation machine 40 receives process gas A from the gas cylinder 91 via the on-off valve 51a in an open state. The cluster generation machine 40 generates the cluster gas by clustering the process gas A. The process gas A may include, for example, inert gas or another type of gas. The inert gas may include Ar gas, $N_2$ gas, $CO_2$ gas, and $O_2$ gas. The another type of gas may include $Cl_2$ gas and $SF_6$ gas.

Figure 2:
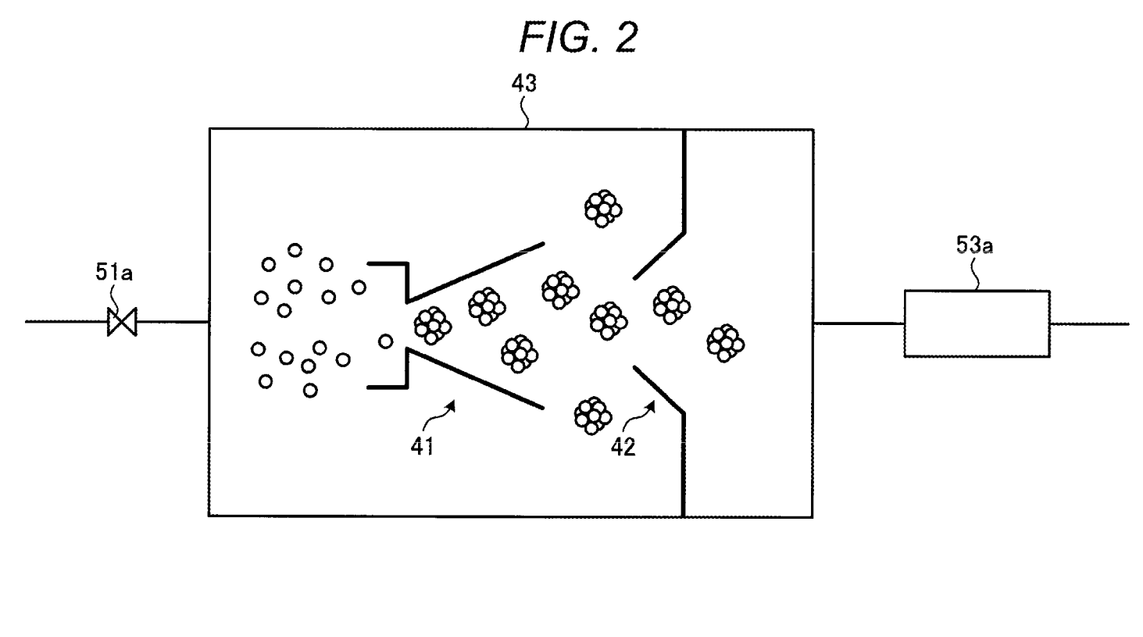
FIG. 2 shows a configuration of a cluster generation machine according to some embodiments.

For example, the cluster generation machine 40 may be configured as denoted in FIG. FIG. 2 shows a configuration of the cluster generation machine 40. The cluster generation machine 40 may include a nozzle 41, a skimmer 42, and a vacuum container 43. The nozzle 41 and the skimmer 42 are disposed in the vacuum container 43. In the vacuum container 43, vacuum evacuation is performed by the evacuation control unit 60 or the like.

The nozzle 41 applies pressure to atoms or molecules with relatively high-pressure (for example, multi atmosphere) and causes the atoms or molecules to be jetted from a small opening of the injection nozzle. A temperature of a supersonic jet stream of the process gas A, which is jetted from the nozzle 41, falls because thermal motion is converted into transitional motion in an adiabatic expansion process. Therefore, atoms or molecules of source gas become a collection of clusters of hundreds to thousands of atoms (molecules) due to van der Waals force, and thus an electrically neutral cluster gas is generated. In a cluster gas proceeding direction, the skimmer 42 is disposed. The skimmer 42 partially divides gas molecules, on which a cluster gas concentration process is not performed, among the process gas A jetted from the nozzle 41, and transmits the cluster gas to a downstream side.

The cluster generation machine 40 denoted in FIG. 1 discharges the generated cluster gas to the flow rate controller 53a.

In the gas supply control unit 50, the process gas A and the process gas B are respectively supplied to the plurality of gas supplying pipes 54a and 54b from the gas cylinders 91 and 92. The plurality of on-off valves 51a and 51b are respectively controlled by the controller 80. Therefore, the on-off valve 51a is opened at predetermined timing, and thus the process gas A is supplied to the cluster generation machine 40. The on-off valve 51b is opened at predetermined timing, and thus the process gas B is supplied to the flow rate controller 53b. The plurality of flow rate controllers 53a and 53b are respectively controlled by the controller 80, and thus the flow rates of the supplied cluster gas and the process gas B are controlled. The plurality of on-off valves 52a to 52c are respectively controlled by the controller 80 and opened at predetermined timings, and thus the cluster gas is supplied from the flow rate controller 53a to the processing chamber 90 via the gas supplying pipes 55a to 55c and the shower head 30. The on-off valve 54 is controlled by the controller 80 and opened at a predetermined timing, and thus the process gas B is supplied from the flow rate controller 53b to the processing chamber 90 via the gas supplying pipe 56 and the shower head 30.

The lower electrode 10 is disposed on a bottom surface side in the processing chamber 90 so as to be insulated from the processing container 2 via an insulating material (not denoted in the drawing). A processed substrate WF, such as a silicon wafer, is placed on the lower electrode 10. The lower electrode 10 includes a stage 11 and an electrode 12. The stage 11 covers the electrode 12. The electrode 12 receives electric power from the plasma generation machine 20, and supplies electric power to the processed substrate WF via the stage 11. The stage 11 and the electrode 12 may be respectively formed of, for example, metal such as stainless steel or aluminum.

The shower head 30 is disposed to face the stage 11, and may function as an upper electrode with respect to the lower electrode 10. The shower head 30 may be formed of, for example, metal such as stainless steel or aluminum. The shower head 30 is electrically grounded. A space surrounded by the shower head 30 and the processing container 2 may function as a diffusion chamber 94 such that the process gas B is diffused.

The shower head 30 includes a plurality of introducing holes (a plurality of first introducing holes) 31 and a plurality of introducing holes (a plurality of second introducing holes) 32. Each of the introducing holes 31 is closed with respect to the diffusion chamber 94 and causes the gas supplying pipes 55a to 55c to be communicated with the processing chamber 90. Therefore, each of the introducing holes 31 is capable of supplying the cluster gas to the processing chamber 90. That is, a route which includes the gas supplying pipe 54a, the on-off valve 51a, the cluster generation machine 40, the flow rate controller 53a, the on-off valves 52a to 52c, the gas supplying pipes 55a to 55c, and the introducing holes 31 forms an introducing route (first introducing route) which introduces the cluster gas to the processing chamber 90.

Each of the introducing holes 32 causes the diffusion chamber 94 and the processing chamber 90 to be communicated with each other. The diffusion chamber 94 is communicated with the gas supplying pipe 56. Therefore, each of the introducing holes 32 is capable of supplying the process gas B to the processing chamber 90. That is, the route which includes the gas supplying pipe 54b, the on-off valve 51b, the flow rate controller 53b, the on-off valve 54, the gas supplying pipe 56, the diffusion chamber 94, and the introducing hole 32 forms an introducing route (second introducing route) which introduces the process gas B to the processing chamber 90.

The plasma generation machine 20 causes the plasma PL of the cluster gas and/or process gas A to occur in the space 93 separated from the lower electrode 10 in the processing chamber 90. Specifically, the plasma generation machine 20 may include a high-frequency power supply 23 and a matching circuit 22. The matching circuit 22 performs impedance adjustment (impedance matching) such that impedance on a side of the high-frequency power supply 23 with respect to the matching circuit 22 and impedance on a side of the electrode 12 with respect to the matching circuit 22 become uniform. In a state in which the impedance matching is obtained, a high-frequency voltage is supplied from the high-frequency power supply 23 to the lower electrode 10. Therefore, a high-frequency electric field is formed between the shower head 30 and the lower electrode 10.

The evacuation control unit 60 controls pressure of the processing chamber 90 and displacement of the process gas. Specifically, the evacuation control unit 60 includes a pressure sensor 61, an evacuation pipe 63, a pressure controller 62, an evacuation pipe 64, and a vacuum pump 65. The pressure sensor 61 senses pressure in the processing chamber 90, and supplies information of a value of the pressure to the pressure controller 62. The pressure controller 62 is connected to the processing chamber 90 via the evacuation pipe 63, and is connected to the vacuum pump 65 via the evacuation pipe 64. The pressure controller 62 includes an adjusting valve (not denoted in the drawing) that adjusts an opening degree, controlled such that the pressure in the processing chamber 90 becomes a target value according to the value of the pressure supplied from the pressure sensor 61. Therefore, the pressure of the processing chamber 90 and the displacement of the process gas are controlled.

The controller 80 controls the respective units of the plasma processing device 1. Specifically, the controller 80 may include a microprocessor or CPU 81 and a memory 82. The memory 82 stores recipe information. The CPU 81 controls the plasma generation machine 20, the gas supply control unit 50, and the evacuation control unit 60 according to respective processing conditions of the recipe information stored in the memory unit 82. Therefore, a plasma process is performed on the processed substrate WF.

For example, if the cluster gas is introduced to the processing chamber 90 via the first introducing route, the controller 80 controls a high-frequency voltage supplied from the high-frequency power supply 23 to the lower electrode 10 to form the high-frequency electric field between the shower head 30 and the lower electrode 10. The plasma PL of the cluster gas thereby occurs in the space 93 separated from the lower electrode 10 in the processing chamber 90. Here, a sheath region having a potential gradient is also formed between a plasma PL region and the lower electrode 10, and ions generated together with radical in the plasma PL are accelerated to the processed substrate WF surface (on a side of the lower electrode 10). Thus the surface treatment may be performed on the processed substrate WF.

Since kinetic energy is applied with respect to the cluster gas which includes a number of atoms that is extremely large compared to monoatomic, energy which is uniformly applied to each of the atoms that are included in the cluster gas becomes extremely small. Therefore, by irradiating the surface of the processed substrate WF with the cluster gas, surface treatment on the processed substrate WF can be performed with low damage.

Otherwise, for example, in a state in which the process gas B is introduced to the processing chamber 90 via the second introducing route, the controller 80 controls the high-frequency voltage supplied from the high-frequency power supply 23 to the lower electrode 10, forming the high-frequency electric field between the shower head 30 and the lower electrode 10. The plasma PL of the process gas B thereby occurs in the space 93 separated from the lower electrode 10 in the processing chamber 90. Here, the sheath region having a potential gradient between the plasma PL region and the lower electrode 10 is also formed, and ions generated together with radicals in the plasma PL are accelerated to the processed substrate WF surface (on the side of the lower electrode 10). Thus anisotropic etching may be performed on the processed substrate WF.

In a state in which the cluster gas is introduced to the processing chamber 90 via the first introducing route and the process gas B is introduced to the processing chamber 90 via the second introducing route, the controller 80 controls the high-frequency voltage supplied from the high-frequency power supply 23 to the lower electrode 10, forming the high-frequency electric field between the shower head 30 and the lower electrode 10. The plasma PL of the cluster gas and the process gas B thereby occurs in the space 93 separated from the lower electrode 10 in the processing chamber 90. Here, the sheath region having a potential gradient between the plasma PL region and the lower electrode 10 is also formed, and ions generated together with radicals in the plasma PL are accelerated to the processed substrate WF surface (on the side of the lower electrode 10). Thus the anisotropic etching may be performed on the processed substrate WF and the surface treatment may be performed on the processed substrate WF.

For example, etching a fine-dimension opening on the film to be processed, sediments can be removed with low damage because of the surface treatment using the cluster gas, even if substances removed via spattering of the surface of the resist or the film to be processed accumulate on the inner side of the parts to be processed (fine-dimension openings) or the like. In this case, the anisotropic etching using the process gas B can be continued without closing the parts to be processed (fine-dimension openings). Therefore, it is possible to process fine-dimension openings having a high aspect ratio.

Figure 3A:
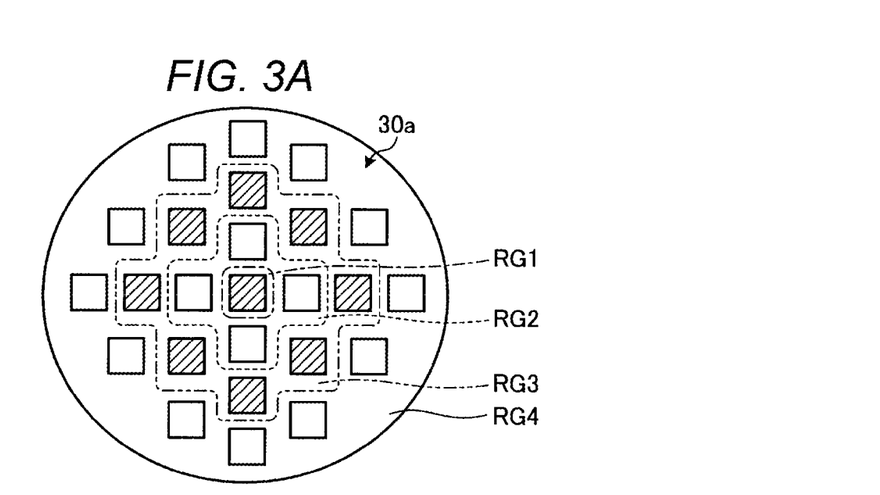
FIGS. 3A to 3C show a configuration of a shower head in a plan view according to some embodiments.
Figure 3B:
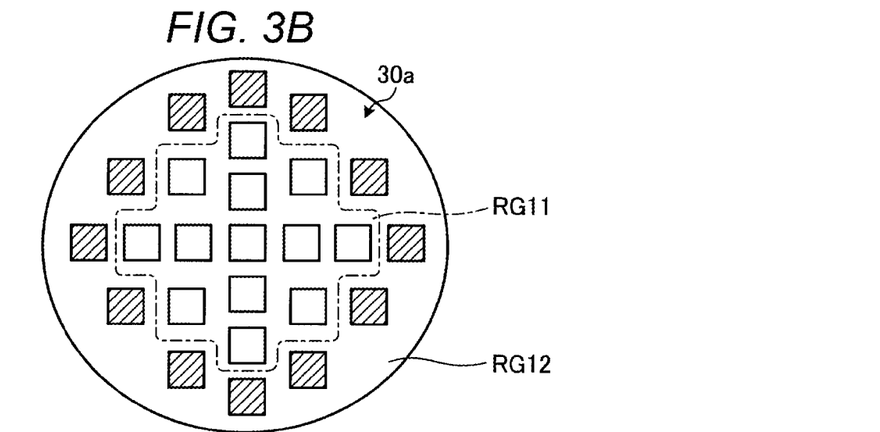
Figure 3C:
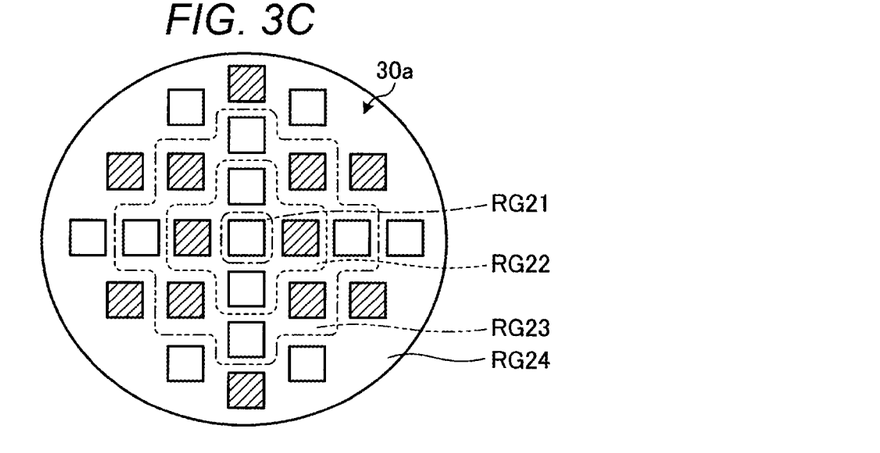

Subsequently, planar dispositions of the plurality of introducing holes 31 and the plurality of introducing holes 32 in the shower head 30 will be described. As denoted in FIGS. 3A to 3O, the plurality of introducing holes and the plurality of introducing holes 32 are two-dimensionally arranged in a principal plane 30*a* of the shower head 30, which faces the stage 11, respectively. FIGS. 3A to 3C show a configuration of the shower head in a plan view. In FIGS. 3A to 3C, a dispositional position of each of the introducing holes 31 which introduce the cluster gas is denoted as a rectangular shape hashed by diagonal lines, and a dispositional position of each of the introducing holes 32, which introduce the process gas B, is denoted as a hollow rectangular shape.

For example, as denoted in FIG. 3A, a plurality of concentric-shaped regions RG1 to RG4 are provided in the principal plane 30*a*, and each of the introducing holes 31 and each of the introducing holes 32 may be alternately disposed from a side of a center. That is, an introducing hole 31 is disposed in the region RG1, the introducing holes 32 are disposed in the region RG2, the introducing holes 31 are disposed in the region RG3, and the introducing holes 32 are disposed in the region RG4. Therefore, it is possible to perform the surface treatment using the cluster gas approximately uniformly with respect to the whole surface of the processed substrate WF. Otherwise, it is possible to selectively perform the surface treatment using the cluster gas with respect to an arbitrary place of the surface of the processed substrate WF.

Alternatively, for example, as denoted in FIG. 3B, an inside of the principal plane 30*a* is divided into a peripheral region RG12 and a region RG11 which is an inside of the region RG12, and the respective introducing holes 31 may be selectively disposed in the peripheral region RG12. The respective introducing holes 32 are disposed inside the region RG11. Therefore, it is possible to perform the surface treatment using the cluster gas on the peripheral region of the surface of the processed substrate WF.

As another alternative, for example, as denoted in FIG. 3C, a plurality of concentric-shaped regions RG21 to RG24 are provided in the principal plane 30*a*, and the introducing holes 31 and the introducing holes 32 may be alternately disposed in the respective regions RG21 to RG24. That is, an introducing hole 31 is disposed in the region RG21, the introducing holes 31 and the introducing holes 32 are circumferentially and alternately disposed in the region RG22, the introducing holes 31 and the introducing holes 32 are circumferentially and alternately disposed in the region RG23, and the introducing holes 31 and the introducing holes 32 are circumferentially and alternately disposed in the region RG24. Therefore, it is possible to perform the surface treatment using the cluster gas approximately uniformly with respect to the whole surface of the processed substrate WF. Otherwise, it is possible to selectively perform the surface treatment using the cluster gas with respect to an arbitrary place of the surface of the processed substrate WF.

As described above, in the embodiment, a configuration is made such that the plasma processing device 1 includes the cluster generation machine 40 and the plasma process of the process gas and the plasma process of cluster gas are respectively performed in the processing chamber 90. Specifically, the plasma generation machine 20 ionizes at least one of the process gas and the cluster gas, and the stage 11 functions as an electrode which draws at least one of the ionized process gas and the cluster gas to a side of the processed substrate WF. Therefore, it is possible to remove the sediments, which occur due to surface spattering or the like, with low damage by performing the surface treatment using the cluster gas while performing the minute etching process on the film to be processed, and thus it is possible to continue the etching process. Therefore, it is possible to easily improve the accuracy of the etching process.

Figure 4:
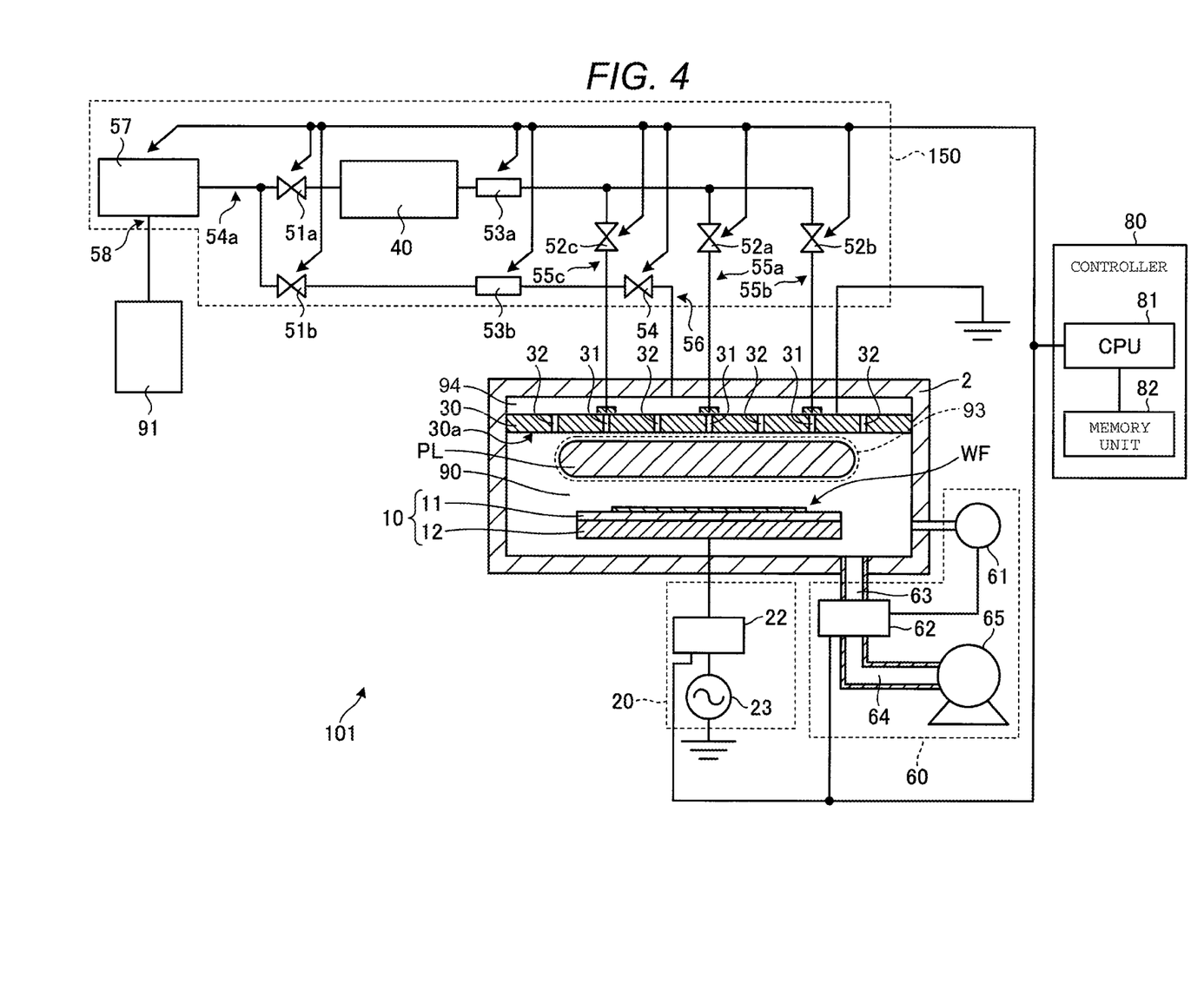
FIG. 4 shows a configuration of a plasma processing device according to a modified example of some embodiments.

Meanwhile, in a case where it is possible to commonize the process gas B and the process gas A, a gas supply control unit 150 may be configured in a plasma processing device 101, as denoted in FIG. 4. FIG. 4 shows a configuration of the plasma processing device 101. That is, the gas cylinder 92 is omitted, the gas supplying pipes 54a and 54b in the gas supply control unit 150 are commonized to the gas supplying pipe 54a, and a valve box 57 and a gas supplying pipe 58 are added. Turning on and off of the valve box 57 is controlled by the controller 80. Therefore, it is possible to reduce the amount of usage of the process gas.

In addition, in the embodiment, a case where the plasma processing device 1 is a parallel-plate RIE device is illustratively described. However, it is possible according to some embodiments to provide a case where the plasma processing device 1 is another type of RIE device. For example, the plasma processing device 1 may be an Inductive Coupling Plasma (ICP)-type RIE device or an Electron Cyclotron Resonance (ECR)-type RIE device.

While certain embodiments have been described, these embodiments have been presented byway of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A plasma processing device comprising:
   a processing container;
   a shower head provided with a plurality of first introducing holes and a plurality of second introducing holes wherein the shower head divides the inside of the processing container into a processing chamber and a diffusion chamber;
   wherein the second introducing holes are connected to the diffusion chamber;
   a stage disposed in the processing chamber and configured to support a substrate;
   a cluster generator configured to generate a cluster gas by clustering a process gas;
   a plasma generator configured to generate plasma of at least one of the process gas or the cluster gas in the processing container, and to process the substrate using the generated plasma,
   wherein the plasma generator is configured to ionize at least one of the process gas or the cluster gas, and
   wherein the stage is arranged as an electrode which draws at least one of the ionized process gas and the cluster gas to a surface of the substrate;
   a first gas supplying pipe supplying gas from a first gas cylinder,
   wherein the first gas supplying pipe is connected to the cluster generator and then branches into a first cluster gas supplying pipe and a second cluster gas supplying pipe, wherein the first cluster gas supplying pipe and the second cluster gas supplying pipe are physically separated from the diffusion chamber and connected to the first introducing holes;
   a second gas supplying pipe supplying gas from a second gas cylinder, wherein the second gas supplying pipe is connected to the diffusion chamber; and
   at least one valve provided to each of the first cluster gas supplying pipe and the second cluster gas supplying pipe.

2. The plasma processing device according to claim 1, wherein the plurality of first introducing holes and the plurality of second introducing holes are two-dimensionally arranged in a principal plane of the shower head, which faces the stage, respectively.

3. The plasma processing device according to claim 2, wherein the plurality of first introducing holes and the plurality of second introducing holes are arranged in concentric regions in the principal plane.

4. The plasma processing device according to claim 3, wherein the concentric regions are alternately arranged to have only the first or the second introducing holes.

5. The plasma processing device according to claim 3, wherein each of the concentric regions has alternately arranged first introducing holes and second introducing holes.

6. The plasma processing device according to claim 2, wherein one of the plurality of first introducing holes or the plurality of second introducing holes is arranged in an outer peripheral region in the principal plane, and the other of the plurality of first introducing holes or the plurality of second introducing holes is arranged in an inner region within the outer region.

7. The plasma processing device according to claim 1, further comprising:
   a controller configured to control the plasma processing device such that the cluster gas is introduced to the processing chamber via the first introducing holes and the process gas is introduced to the processing chamber via the second introducing holes, simultaneously.

8. The plasma processing device according to claim 1, wherein the first gas supplying pipe branches into at least the first cluster gas supplying pipe, the second cluster gas supplying pipe and a third cluster gas supplying pipe, and at least one valve is provided to each of the cluster gas supplying pipes.

9. A plasma processing device comprising:
   a processing container;
   a shower head provided with a plurality of first introducing holes and a plurality of second introducing holes wherein the shower head divides the inside of the processing container into a processing chamber and a diffusion chamber;
   wherein the second introducing holes are connected to the diffusion chamber;
   a stage disposed in the processing chamber and configured to support a substrate;
   a cluster generator configured to generate a cluster gas by clustering a process gas; and
   a plasma generator configured to generate plasma of at least one of a process gas or the cluster gas in the processing container, and to process the substrate using the generated plasma,
   wherein the plasma generator is configured to ionize at least one of the process gas or the cluster gas, and
   wherein the stage is arranged as an electrode which draws at least one of the ionized process gas and the cluster gas to a surface of the substrate;
   a first gas supplying pipe supplying gas from a first gas cylinder;
   wherein the first gas supplying pipe is connected to the cluster generator and then branches into a plurality of cluster gas supplying pipes, the plurality of cluster gas supplying pipes are physically separated from the diffusion chamber and connected to the first introducing holes; and a second gas supplying pipe supplying gas from a second gas cylinder is connected to the diffusion chamber;

wherein the first introducing holes are only provided at a peripheral portion of the shower head.

10. The plasma processing device according to claim 9, wherein the first gas supplying pipe branches into at least three cluster gas supplying pipes, and at least one valve provided to each of the cluster gas supplying pipes.

11. The plasma processing device according to claim 9, wherein the plurality of first introducing holes and the plurality of second introducing holes are two-dimensionally arranged in a principal plane of the shower head, which faces the stage, respectively.

12. The plasma processing device according to claim 11, wherein the plurality of first introducing holes and the plurality of second introducing holes are arranged in concentric regions in the principal plane.

13. The plasma processing device according to claim 9, further comprising:

a controller configured to control the plasma processing device such that the cluster gas is introduced to the processing chamber via the first introducing holes and the process gas is introduced to the processing chamber via the second introducing holes, simultaneously.

* * * * *